(12) United States Patent
Lim

(10) Patent No.: US 10,802,312 B2
(45) Date of Patent: *Oct. 13, 2020

(54) DISPLAY DEVICE WITH COVER WINDOW

(71) Applicant: Samsung Display Co., Ltd., Yongin-si (KR)

(72) Inventor: Sang-Hyun Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,298

(22) Filed: Feb. 25, 2019

(65) Prior Publication Data

US 2019/0187507 A1    Jun. 20, 2019

Related U.S. Application Data

(63) Continuation of application No. 14/171,240, filed on Feb. 3, 2014, now Pat. No. 10,216,020.

(30) Foreign Application Priority Data

Jun. 3, 2013 (KR) .................. 10-2013-0063506

(51) Int. Cl.
 G02F 1/1333 (2006.01)
 H05K 1/02 (2006.01)
 G02F 1/1345 (2006.01)
 H04M 1/02 (2006.01)
 H04M 1/18 (2006.01)

(52) U.S. Cl.
 CPC .... *G02F 1/133308* (2013.01); *G02F 1/13452* (2013.01); *G02F 1/133305* (2013.01); *H04M 1/0268* (2013.01); *H05K 1/028* (2013.01); *G02F 2001/13332* (2013.01); *H04M 1/185* (2013.01)

(58) Field of Classification Search
 CPC ......... G02F 1/133308; G02F 1/133608; G02F 1/13452; G02F 2001/133334
 See application file for complete search history.

(56) References Cited

U.S. PATENT DOCUMENTS

| | | |
|---|---|---|
| 5,838,412 A | 11/1998 | Ueda et al. |
| 6,411,353 B1 | 6/2002 | Yarita et al. |
| 7,032,984 B2 | 4/2006 | Kim et al. |
| 7,620,175 B2 | 11/2009 | Black et al. |

(Continued)

FOREIGN PATENT DOCUMENTS

| | | |
|---|---|---|
| CN | 1383503 | 12/2002 |
| CN | 1996118 | 7/2007 |

(Continued)

OTHER PUBLICATIONS

Office Action dated Sep. 20, 2017, in Taiwanese Patent Application No. 103118385.

(Continued)

*Primary Examiner* — Dung T Nguyen
(74) *Attorney, Agent, or Firm* — H.C. Park & Associates, PLC

(57) ABSTRACT

A display device includes a flexible display panel and a cover window. The flexible display panel includes a display area to display an image and a pad area extending from the display area. The pad area is bent from the display area. The cover window is disposed on the flexible display panel.

24 Claims, 10 Drawing Sheets

(56) References Cited

U.S. PATENT DOCUMENTS

| | | | |
|---|---|---|---|
| 7,719,627 | B2 | 5/2010 | Okuda |
| 7,894,013 | B2 | 2/2011 | Chung et al. |
| 8,250,724 | B2 | 8/2012 | Dabov et al. |
| 8,472,114 | B2 | 6/2013 | Watanabe |
| 8,572,893 | B2 | 11/2013 | Watanabe |
| 8,736,162 | B2 | 5/2014 | Jin et al. |
| 8,797,234 | B2 | 8/2014 | Watanabe et al. |
| 8,804,317 | B2 | 8/2014 | Watanabe |
| 9,075,258 | B2 | 7/2015 | Watanabe |
| 9,507,192 | B2 * | 11/2016 | Lim .................... H04M 1/0266 |
| 10,216,020 | B2 * | 2/2019 | Lim .................... H04M 1/0268 |
| 2011/0007042 | A1 | 1/2011 | Miyaguchi |
| 2011/0285934 | A1 | 11/2011 | Watanabe |
| 2011/0310488 | A1 | 12/2011 | Tomotoshi et al. |
| 2013/0002133 | A1 | 1/2013 | Jin et al. |
| 2013/0154949 | A1 | 6/2013 | Jamshidi Roudbari et al. |
| 2013/0169515 | A1 | 7/2013 | Prushinskiy et al. |
| 2014/0183473 | A1 | 7/2014 | Lee et al. |
| 2014/0247405 | A1 | 9/2014 | Jin et al. |
| 2014/0300557 | A1 | 10/2014 | Cho et al. |
| 2014/0362326 | A1 | 12/2014 | Terazawa et al. |
| 2019/0393433 | A1 * | 12/2019 | Dagn .................... H01L 51/5253 |

FOREIGN PATENT DOCUMENTS

| | | |
|---|---|---|
| CN | 101339304 | 1/2009 |
| CN | 102067197 | 5/2011 |
| CN | 102257549 | 11/2011 |
| CN | 102308328 | 1/2012 |
| CN | 102308329 | 1/2012 |
| CN | 102460281 | 5/2012 |
| CN | 102473363 | 5/2012 |
| CN | 102598093 | 7/2012 |
| CN | 102855821 | 1/2013 |
| CN | 202650440 | 1/2013 |
| KR | 10-2010-0019729 | 2/2010 |
| KR | 10-2011-0005510 | 1/2011 |
| KR | 10-2011-0051277 | 5/2011 |
| KR | 10-2013-0004085 | 1/2013 |
| KR | 10-2013-0007311 | 1/2013 |
| KR | 10-2014-0093360 | 7/2014 |
| TW | 201311066 | 3/2013 |
| WO | 2013/048881 | 4/2013 |

OTHER PUBLICATIONS

Office Action dated Nov. 3, 2017, in Chinese Patent Application No. 201410171952.X.

Office Action dated Jul. 11, 2018, in Chinese Patent Application No. 201410171952.X.

Notice of Allowance dated Oct. 4, 2018, in U.S. Appl. No. 14/171,240.

Final Office Action dated May 17, 2018, in U.S. Appl. No. 14/171,240.

Non-Final Office Action dated Oct. 5, 2017, in U.S. Appl. No. 14/171,240.

Final Office Action dated Apr. 21, 2017, in U.S. Appl. No. 14/171,240.

Non-Final Office Action dated Sep. 30, 2016, in U.S. Appl. No. 14/171,240.

Final Office Action dated Jun. 1, 2016, in U.S. Appl. No. 14/171,240.

Non-Final Office Action dated Nov. 19, 2015, in U.S. Appl. No. 14/171,240.

Office Action dated Mar. 11, 2019, in Korean Patent Application No. 10-2013-0063506.

Chinese Office Action dated Aug. 5, 2020, in Chinese Patent Application No. 201910111629.6.

* cited by examiner

DISPLAY DEVICE WITH COVER WINDOW

CROSS-REFERENCE TO RELATED APPLICATION

This application is a Continuation of U.S. patent application Ser. No. 14/171,240, filed Feb. 3, 2014, which issued as U.S. Pat. No. 10,216,020, and claims priority to and the benefit of Korean Patent Application No. 10-2013-0063506, filed Jun. 3, 2013, each of which is incorporated by reference for all purposes as if set forth herein.

BACKGROUND

Field

Exemplary embodiments relate to display technology, and, more particularly, to a flexible display panel and a display device with a cover window.

Discussion

Conventional display devices may include a display panel configured to display an image and a cover window to cover the display panel, and, thereby, configured to protect the display panel. The display panel may be divided into a display area configured to display an image and a non-display area, which may surround (or otherwise bound) the display area. The cover window may be divided into a transparent area corresponding to the display area and an opaque bezel area corresponding to the non-display area.

It is noted that the non-display area of the display panel may include a black matrix (BM) area (or light blocking member) including a smaller width through which some wires may pass and a pad area including a larger width through which all (or a larger number of) wires may pass. An integrated circuit chip may be mounted on the pad area. Pad electrodes may be located in the pad area to allow the pad area to be connected with a chip-on-film (COF) or flexible printed circuit board (FPCB). To this end, the BM area may contact a number of (e.g., three) edges of the display area, and the pad area may contacts a remaining number (e.g., one) edges of the display area.

It is recognized that an electronic device (such as a mobile device) including the aforementioned display device, may also include various other components, such as, for example, a speaker (or other transducer), a camera, a proximity sensor, a physical button, a capacitive (or other touchscreen) button, a microphone, and the like. These various other components may be disposed on or behind the bezel area of the cover window. In a mobile device, for example, the pad area may be disposed at a lower side (or end) of the display area to provide a secure grip feeling. In this manner, various ones of the other aforementioned components may disposed at an upper or lower side (or end) of the display area. That is, when the bezel area is divided into top, bottom, left, and right areas (or regions) of the display area when considered in a plan view, the left and right bezel areas may have a smaller width since the left and right bezel areas may simply correspond to the BM area. The bottom bezel area, however, may cover the pad area, as well as maintain a larger width since one or more of the other aforementioned components may be disposed in association therewith. The top bezel area may include a smaller width than the bottom bezel area, but may not be any larger than the bottom bezel area for aesthetic reasons.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device configured to reduce a width of a bezel area, increase a size of a display area in an electronic device through the reduction in the width of the bezel area, and increase a degree of freedom with respect to its design.

Additional aspects will be set forth in the detailed description which follows and, in part, will be apparent from the disclosure, or may be learned by practice of the inventive concept.

According to exemplary embodiments, a display device includes a flexible display panel and a cover window. The flexible display panel includes a display area to display an image and a pad area extending from the display area. The pad area is bent from the display area. The cover window is disposed on the flexible display panel.

According to exemplary embodiments, a display device includes: a flexible display panel and a cover window. The flexible display panel includes a display area and a pad area. The cover window is disposed on the flexible display panel. The cover window includes a flat portion and curved portions extending from respective sides of the flat portion. Each of the curved portions includes an arcuately-shaped external surface and an arcuately-shaped internal surface. A distance between the arcuately-shaped external surface and the arcuately-shaped internal surface increases with increasing distance from the flat portion. The display area is disposed in association with the flat portion. The pad area is bent from the display area.

According to exemplary embodiments, a left bezel area and a right bezel area of a cover window of a display device may correspond to a black matrix area and an exposed area, respectively. In this manner, a grip feeling of an electronic device (such as a mobile device) may be enhanced by minimizing (or at least reducing) the respective widths of the left and right bezel areas. To this end, a lower bezel area may not need a part to cover a pad area, such that a minimum width to suitably arrange components of the electronic device may be reduced. That is, the width of the lower bezel area may be reduced in comparison to conventional electronic devices including a display device according to exemplary embodiments. In addition, a width of the upper bezel area, which may be the same as the width of the lower bezel area, may also be reduced to improve design aesthetics.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification, illustrate exemplary embodiments of the inventive concept, and together with the description serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
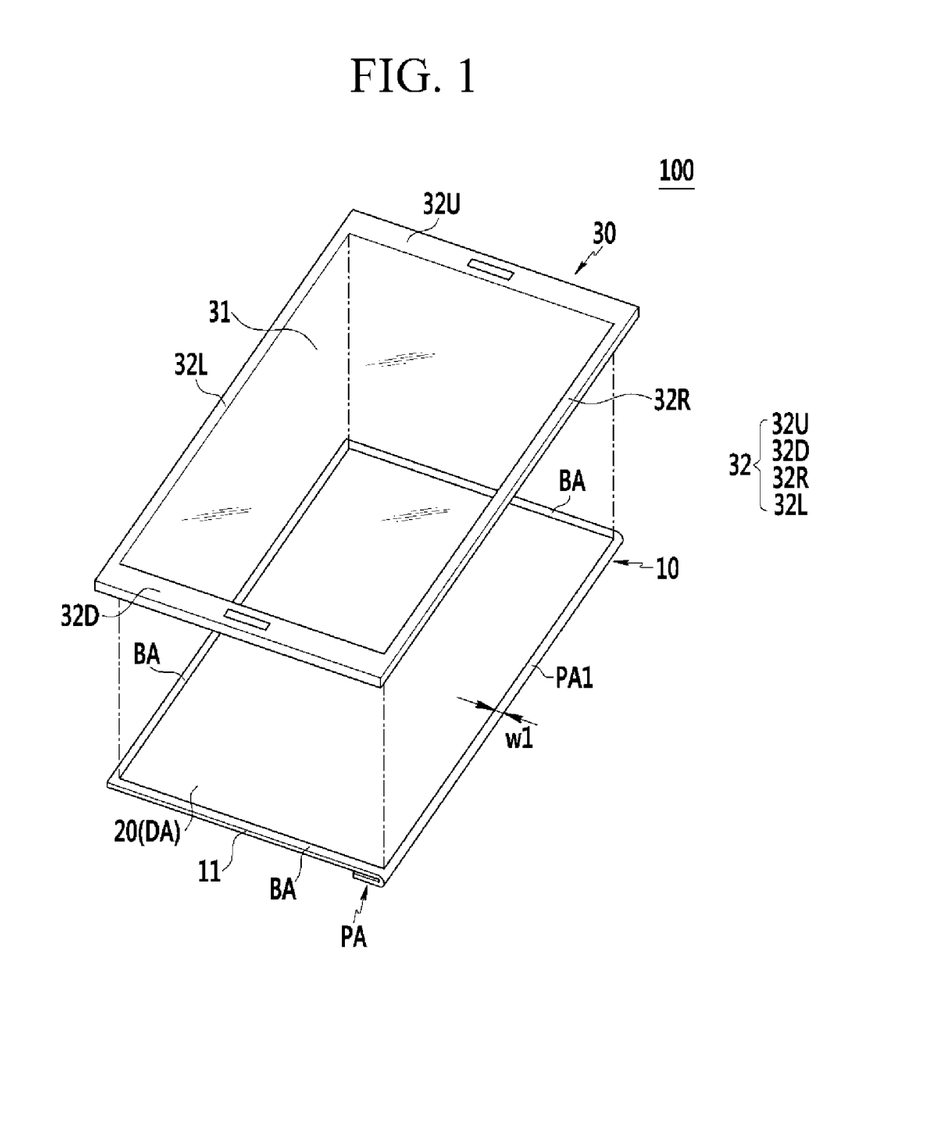
FIG. 1 is an exploded perspective view of a display device, according to exemplary embodiments.
Figure 2:
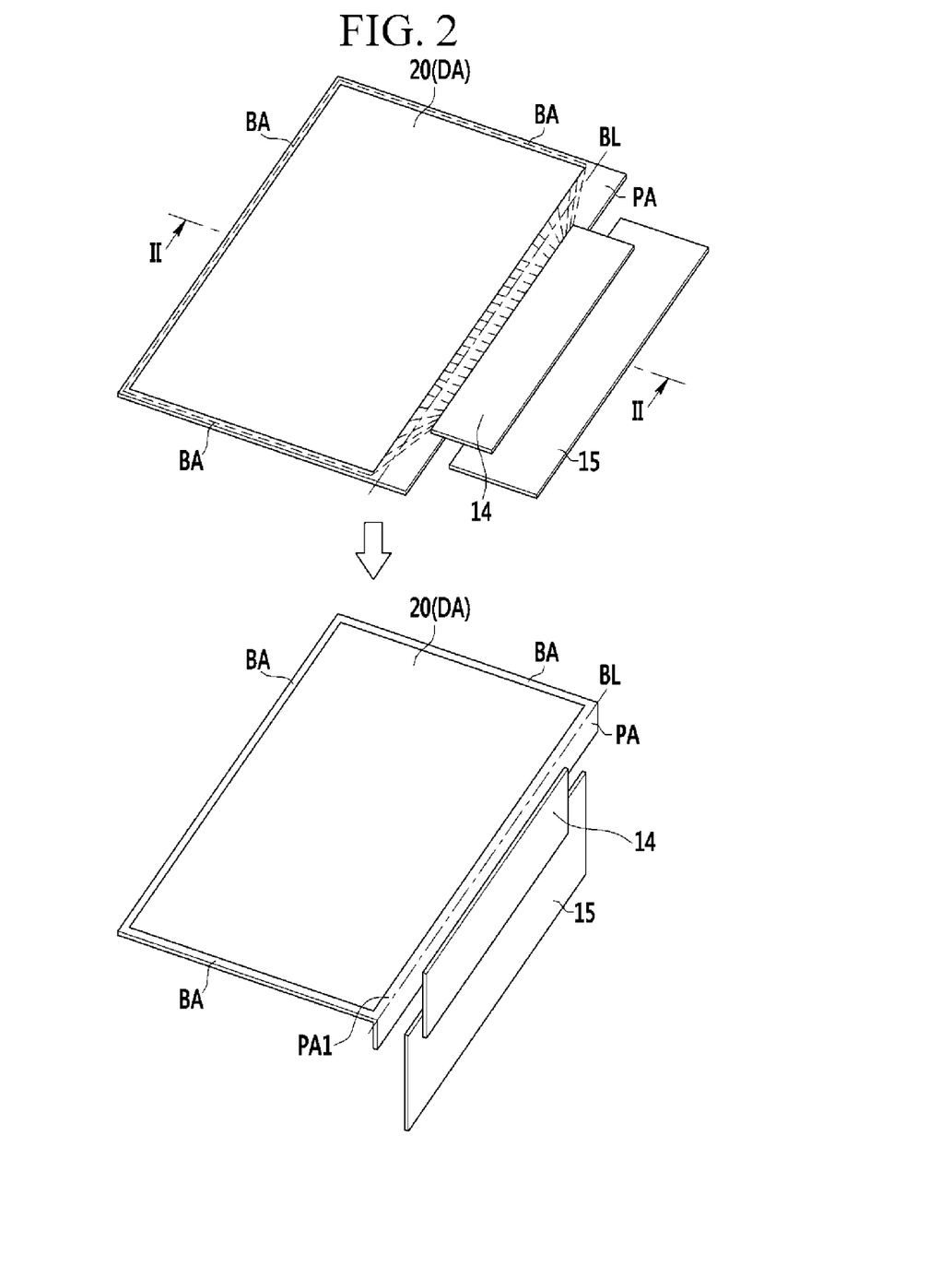
FIG. 2 is a perspective view of a flexible display panel of the display device of FIG. 1, according to exemplary embodiments.

FIG. 1 is an exploded perspective view of a display device, according to exemplary embodiments. FIG. 2 is a perspective view of a flexible display panel of the display device of FIG. 1.

Referring to FIGS. 1 and 2, a display device 100 includes a flexible display panel 10 and a cover window 30 disposed on the flexible display panel 10. The cover window 30 covers the flexible display panel 10 to protect the flexible display panel 10 from external impacts, scratches, contaminants, and/or the like. The flexible display panel 10 may be attached (or otherwise coupled) to the cover window 30 via a transparent adhesive layer (not shown); however, any other suitable coupling mechanism may be utilized, such as, for example, chemical bonding, mechanical fasteners, etc.

According to exemplary embodiments, the flexible display panel 10 is a bendable display panel and includes a flexible substrate 11 and a display unit 20 formed on the flexible substrate 11. The flexible substrate 11 may be formed of a polymer film, such as, for instance, polyimide, polycarbonate, etc., and/or formed one or more metal foils. It is contemplated, however, that any other suitable materials may be utilized. The display unit 20 may include a plurality of pixels (not shown), as well as may be configured to combine light emitted from the plurality of pixels to display an image.

FIGS. 3A and 3B are respective cross-sectional views of the flexible display panel of FIG. 2 taken along sectional line II-II, according to exemplary embodiments.

Figure 3:
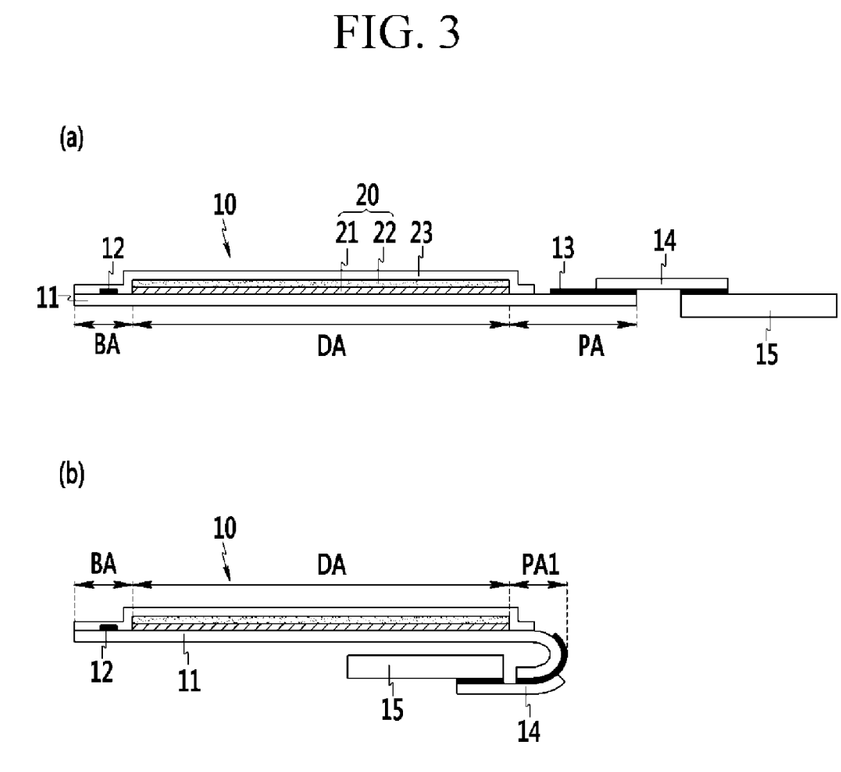
FIGS. 3A and 3B are respective cross-sectional views of the flexible display panel of FIG. 2 taken along sectional line II-II, according to exemplary embodiments.

Referring to FIGS. 1 to 3, the flexible display panel 10 is divided into a display area DA in which the display unit 20 is formed and a non-display area disposed outside the display area DA. The non-display area may be divided into a black matrix (BM) area BA through which at least one or more wires (or transmission lines) may pass and a pad area PA through which one or more (e.g., all) wires pass. In this manner, pad electrodes may be disposed in the pad area PA. As seen in FIG. 3, call reference number 12 corresponds to a wire disposed in the BM area BA, whereas call reference number 13 corresponds to a pad electrode disposed in the pad area PA.

The BM area BA may contact multiple (e.g., three) edges of the display area DA, and the pad area PA may contact at least one remaining area of the display area DA. The pad area PA may have a larger width than the width of the BM area BA. For example, the BM area BA may be formed having a width of about 1 mm, and the pad area PA may be formed having a width of about 3 to 5 mm. An integrated circuit chip (not shown) may be mounted (or otherwise coupled) to the pad area PA.

The flexible display panel 10 may be an organic light emitting display panel; however, any other suitable display panel may be utilized. When formed as an organic light emitting display panel, each pixel may include a pixel circuit including at least one switching unit (e.g., at least one thin film transistor), at least one capacitor, and at least one organic light emitting diode, of which light emission is controlled via the pixel circuit. FIGS. 3A and 3B schematically illustrate the display unit 20 including a pixel circuit layer 21 and an organic light emitting diode layer 22. The display unit 20 may be covered and sealed (e.g., hermetically sealed) by a thin film sealing layer 23. The wires (e.g., wire 12) may connect the pixel circuits of the display area DA and the pad electrodes (e.g., pad electrode 13) of the pad area PA. The pad electrodes 13 arranged in the pad area PA may be electrically and physically connected with the wires 12 disposed at (or near) a first (e.g., output) side of a flexible printed circuit board (FPCB) 14 by an anisotropic conductive film (ACF). Further, the wires 12 at a second (e.g., input) side of the flexible printed circuit board 14 may be electrically and physically connected with a printed circuit board (PCB) 15 by the anisotropic conductive film. In this manner, a control signal output from the printed circuit board 15 may be transmitted to a pixel circuit of the display area DA via the flexible printed circuit board 14 and the wire 12. It is contemplated, however, that a chip on film (COF) to which an integrated circuit chip may be mounted may also be used instead of the flexible printed circuit board 14.

As seen in FIG. 3B, the pad area PA may be folded or bent, such as folded or bent back towards the display area DA, such that the display area DA is disposed over the printed circuit board 15. That is, as illustrated in FIG. 2, the pad area PA may be disposed on a bending line BL in a state where the pad area PA is flat. In this manner, the pad area PA may be folded or bent about the bending line BL, such that the printed circuit board 15 is rotated about the blending line BL in, for example, a clockwise direction. As such, the display area DA may be disposed over the printed circuit board 15, as seen in FIG. 3B.

According to exemplary embodiments, since the flexible substrate 11 may be easily bent and folded when there is no external factor interrupting the bending, the pad area PA may be easily folded or bent under the display area DA. This may be contingent upon no external factor interrupting the bending, such as an integrated circuit chip being disposed on the bending line BL. In other words, the integrated circuit chip may be disposed in a portion of the pad area PA at a sufficient distance from the bending line BL so that the pad area PA may be sufficiently bent in the aforementioned manner. When the pad area PA is folded or bent as previously described, a part of the flexible printed circuit board 14 may also folded or bent. In this manner, at least a portion of the flexible printed circuit board 14 and the printed circuit board 15 may be disposed under or behind the display area DA.

In exemplary embodiments, as the pad area PA is folded or bent as previously described, a portion of the pad area PA that contacts the display area DA may be located in parallel with the display area DA and exposed outside the display area DA. That is, the pad area PA may be exposed outside the display area DA in a state where there is no cover window 30, and, thereby, may include an exposed area PA1 that may be observed together with the display area DA. As seen in FIG. 1, a width of the exposed area PA1 is indicated as w1. The width of the exposed area PA1 may be about 1 mm, which may be the same as the width of the BM area BA. Unlike conventional display panels including an entire pad area PA disposed outside the display area DA, exemplary embodiments may include just a portion of the pad area PA, e.g., the exposed area PA1, which is disposed outside the display area DA.

Figure 4:
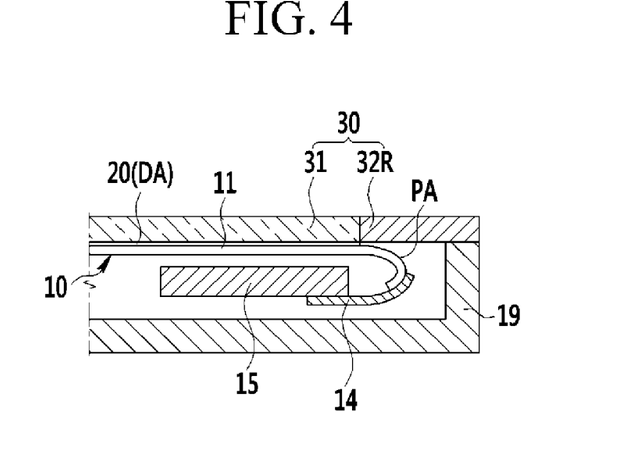
FIG. 4 is a partial cross-sectional view of an assembled state of the display device of FIG. 1, according to exemplary embodiments.

FIG. 4 is a partial cross-sectional view of an assembled state of the display device of FIG. 1, according to exemplary embodiments.

Referring to FIGS. 1 and 4, the cover window 30 may include a transparent area 31 configured in association with the display area DA and an opaque bezel area (or bezel area) 32 configured in association with the non-display area. Since the pad area PA may be folded or bent under the display area DA, the non-display area may correspond to the BM area BA and the exposed area PA1. That is, in exemplary embodiments, the bezel area 32 may correspond to the BM area BA and the exposed area PA1.

According to exemplary embodiments, the cover window 30 may include any suitable material, such as for example, at least one of high strength tempered glass, poly (methyl methacrylate) (PMMA), and polycarbonate (PC). In this manner, the cover window 30 may be at least scratch resistant. The cover window 30 may be coupled to the flexible display panel 10 and a case 19, which may receive various components.

The bezel area 32 may be divided into various portions, such as an upper bezel area (or portion) 32U, a lower bezel area (or portion) 32D, a left bezel area (or portion) 32L, and a right bezel area (or portion) 32R of the display area DA. It is noted, however, that the various portions of the bezel area 32 may be alternatively configured and/or reference in an alternative manner. As seen in FIGS. 1 and 4, the upper and lower portions 32U and 32D of the bezel area 32 may be referred to as such based on a viewpoint of a user observing an electronic device, such as, for example, a mobile device, including the display device 100. It is also noted that the upper and lower portions 32U and 32D of the bezel area 32 may be referred to as such based on an orientation of the display device 100 when, for example, at least one character (e.g., an alphanumeric character) is displayed in an erect, upright, and readable manner, such as, not in a rotated or up-side-down manner. As such, the left and right portions 32L and 32R of the bezel area 32 may be disposed orthogonal to the upper and lower portions 32U and 32D.

According to exemplary embodiments, an electronic device including the display device 100 may further include various other components, such as, for example, a speaker, a camera, a proximity sensor, a physical button, a capacitive button, a microphone, etc., and/or combinations thereof. To this end, the components may be disposed on or behind the bezel area 32 of the cover window 30. When, for example, the display device 100 is included as part of a mobile device, these "other" components may be dividedly disposed in association with the upper bezel area 32U and the lower bezel area 32D, which may enhance the ergonomics (e.g., look, grip, etc.) of the mobile device.

In exemplary embodiments, the exposed area PA1 may contact a side part (e.g., a left end part or a right end part) of the display area DA. That is, the exposed area PA1 may not be disposed behind the lower bezel area 32D, but may be disposed behind one of the left bezel area 32L and the right bezel area 32R portions of the bezel area 32. FIGS. 1 and 4 provide an illustrative example of the exposed area PA1 being disposed behind the right bezel area 32R. It is also noted that the left bezel area 32L and the right bezel area 32R may correspond to the BM area BA and the exposure area PA1, respectively. In this manner, an ergonomic grip feeling of an electronic device (e.g., mobile device) including the display device 100 may be enhanced by minimizing (or at least reducing) the respective widths of the left bezel area 32L and the right bezel area 32R of the bezel area 32. Further, since the lower bezel area 32D may not include a component or part covering the pad area PA (unlike conventional display devices), a width of the lower bezel area 32D may be sized in consideration of those "other" components disposed in association therewith, and, thereby, made smaller than conventional lower bezel areas. In addition, exemplary embodiments also enable a width of the upper bezel area 32U to be reduced in accordance with the width of the lower bezel area 32D. That is, the width of the upper bezel area 32U may be the same as (or at least similar to) the width of the lower bezel area 32D.

Figure 5A:
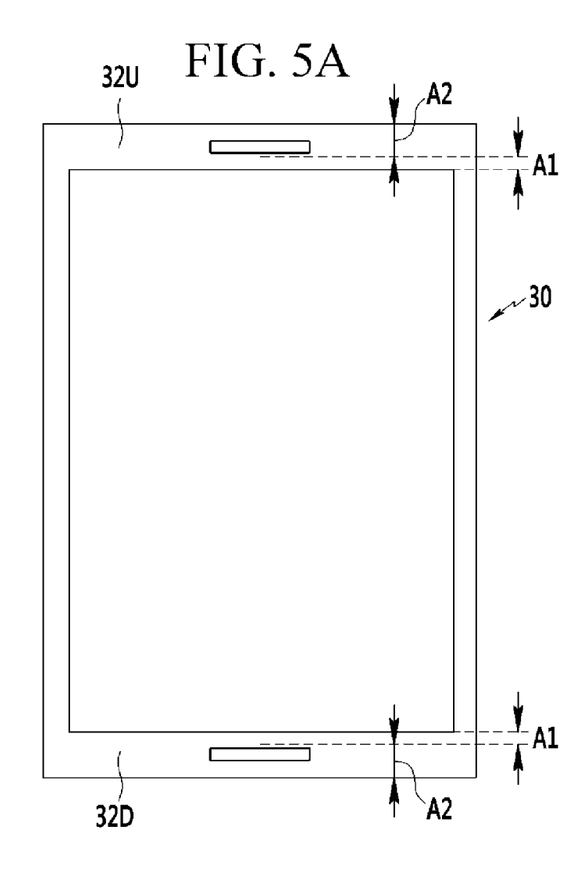
FIGS. 5A and 5B are respective plan views of an exemplary cover window and a comparative cover window, according to exemplary embodiments.
Figure 5B:
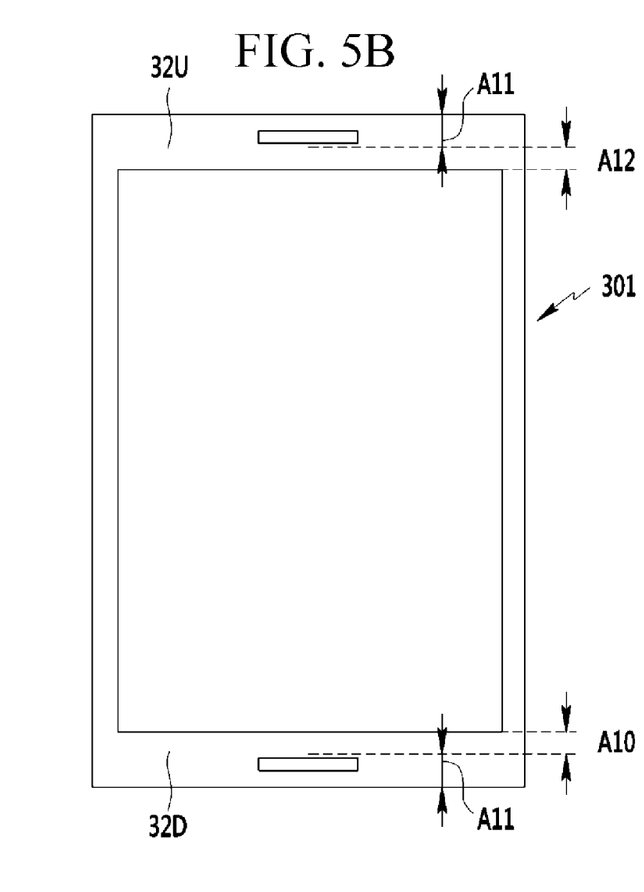

FIGS. 5A and 5B are respective plan views of an exemplary cover window and a comparative cover window, according to exemplary embodiments. That is, FIG. 5A illustrates the cover window 30 according to exemplary embodiments, whereas FIG. 5B illustrates a comparative cover window 301.

As seen in FIG. 5B, the lower bezel area 32D includes an area A10 to cover an associated pad area and an area A11 to arrange components in association therewith. Further, since the upper bezel area 32U generally has the same width as the lower bezel area 32D, an additional area A12 may be provided, in addition to the area A11 disposed in association with the upper bezel area 32U.

As seen in FIG. 5A, the lower bezel area 32D includes a first area A1 to cover the BM area BA and a second area A2 to arrange components in association therewith. Since a width of the first area A1 may be smaller than a width of the area A10, the width of the lower bezel area 32D (e.g., A1+A2) according to exemplary embodiments may be smaller than an associated width (e.g., A10+A11) of the comparative example. The upper bezel area 32U may also include the first area A1 to covering the BM area BA and the second area D2 to arrange components in association therewith. To this end, the width (e.g., A1+A2) of the upper bezel area 32 may be relatively smaller than the width (e.g., A11+A12) of the upper bezel area 32U in the comparative example.

Adverting back to FIGS. 1 and 4, the exposed area PA1 may be disposed behind the lower bezel area 32D with a similar effect as previously described. It is noted, however, that since various "other" components of the electronic device including the display device 100 may be disposed behind the lower bezel area 32D, a defect may be generated due, at least in part, to interference(s) between the bent pad area PA and the "other" components. Further, installation of a structure to support the pad area PA may be relatively difficult. It is contemplated, however, that the exposed area PA1 may be disposed behind one or more of the lower bezel area 32D and the upper bezel area 32U.

As described above, however, since the "other" components of an electronic device including the display device 100 may not be disposed behind the left and right bezel areas 32L and 32R, interference between the bent pad area PA and the "other" components may be prevented. To this end, installation of a structure to support the pad area PA may be relatively simple. That is, the pad area PA of the display device 100 may be bent to minimize a width of the exposed area PA1 and may be disposed at a position where interference between the pad area PA and various "other" components of an electronic device including the display device 100 is prevented. As such, generation of defects may be prevented or otherwise reduced.

Figure 6:
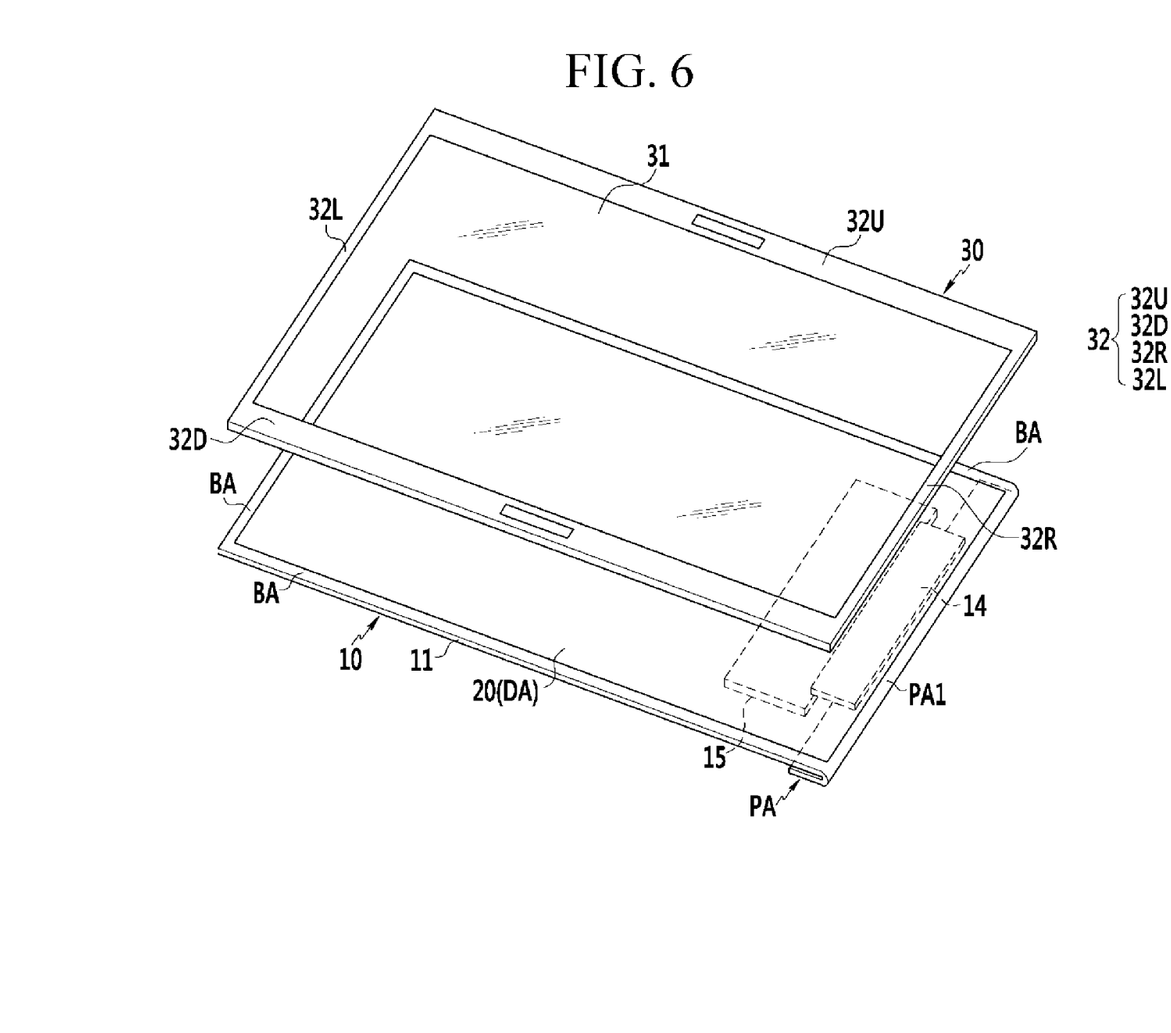
FIG. 6 is an exploded perspective view of a modified example of the display device of FIG. 1, according to exemplary embodiments.

According to exemplary embodiments, the display area DA may be formed according to a "portrait" type, in which the longitudinal lengths of the upper and lower portions 32U and 32D of the bezel area 32 are smaller than the longitudinal lengths of the left and right portions 32L and 32R, or may be formed according to a "landscape" type, in which the longitudinal lengths of the left and right portions 32L and 32R of the bezel area 32 are smaller than the longitudinal lengths of the upper and lower portions 32U and 32D of the bezel area 32. It is noted that FIG. 1 illustrates a portrait-type display area DA, whereas FIG. 6 illustrates a landscape-type display area DA. Besides the relative sizing differences, the display devices 100 of FIGS. 1 and 6 are substantially the same, and, as such, to avoid obscuring exemplary embodiments described herein, duplicative descriptions are omitted.

Figure 7:
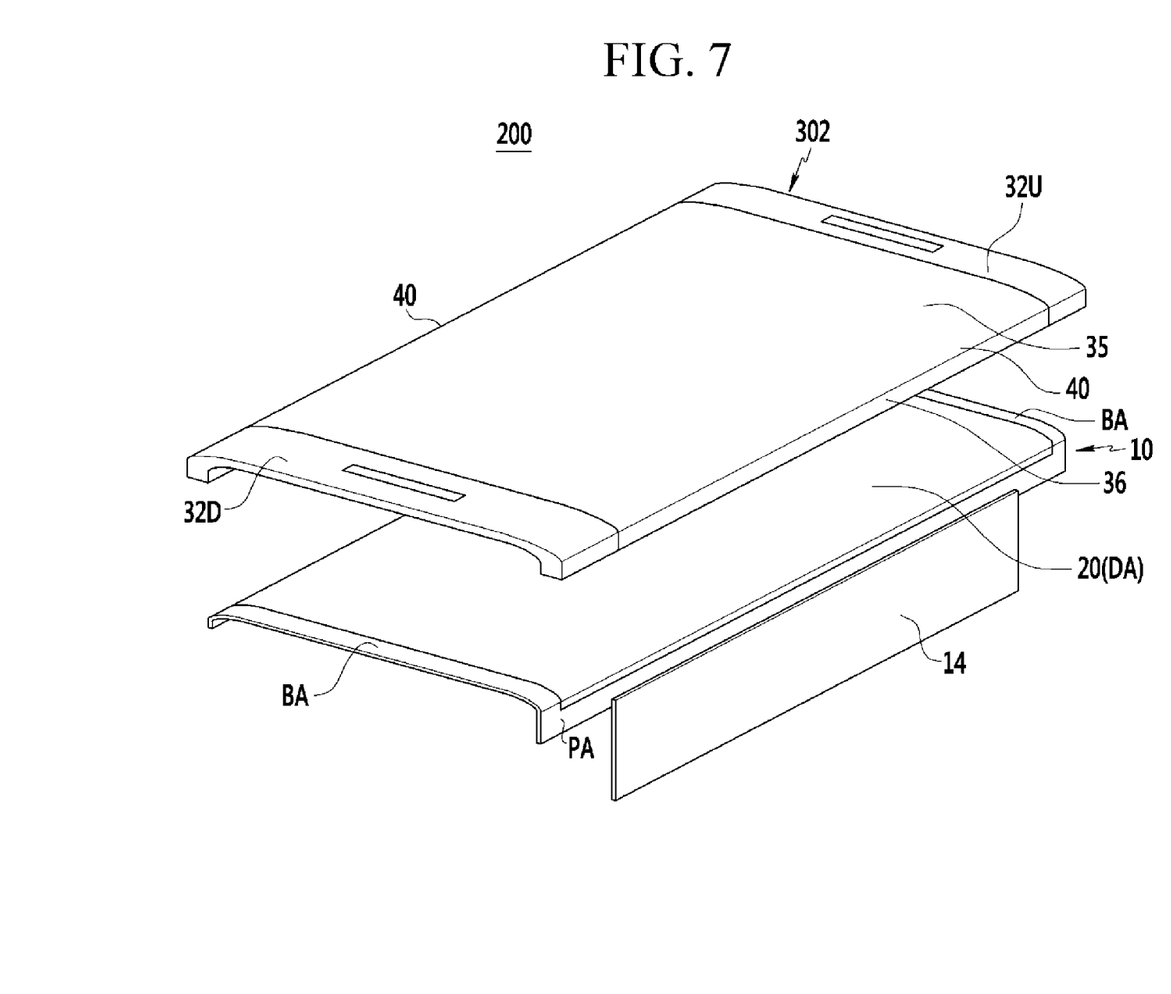
FIG. 7 is an exploded perspective view of a display device, according to exemplary embodiments.
Figure 8:
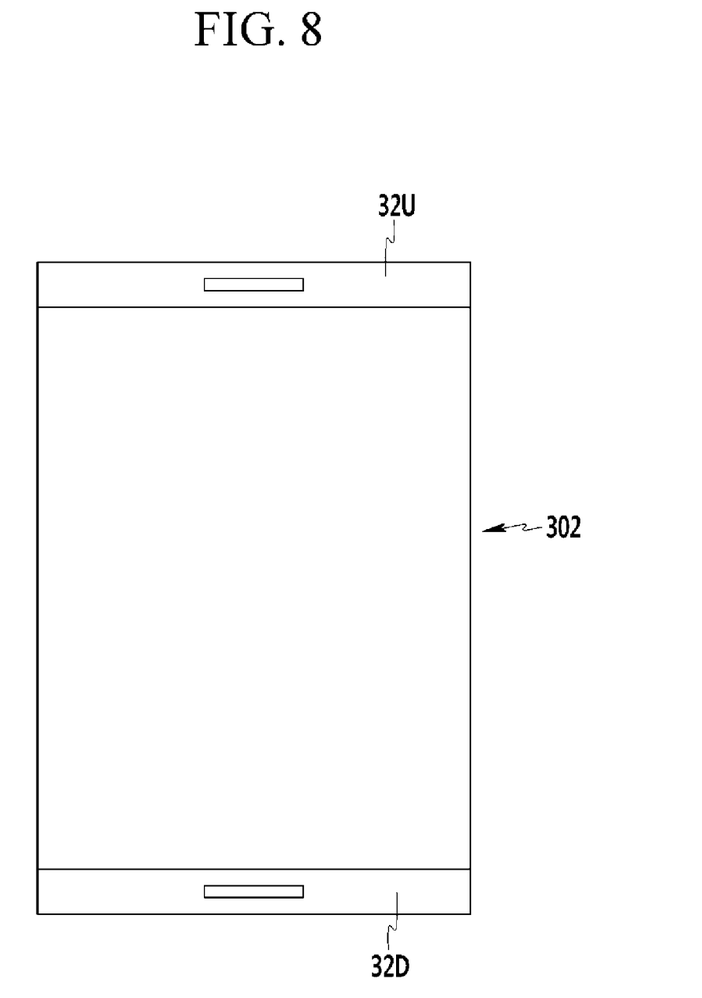
FIG. 8 is a plan view of a cover window of the display device of FIG. 7, according to exemplary embodiments.
Figure 9:
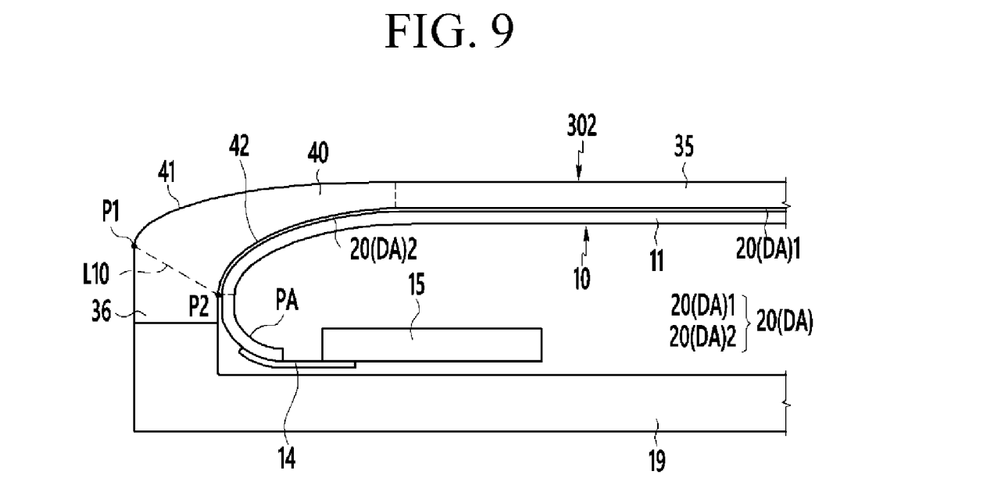
FIG. 9 is a partial cross-sectional view of an assembled state of the display device of FIG. 7, according to exemplary embodiments.

FIG. 7 is an exploded perspective view of a display device, according to exemplary embodiments. FIG. 8 is a plan view of a cover window of the display device of FIG. 7. FIG. 9 is a partial cross-sectional view of an assembled state of the display device of FIG. 7.

Referring to FIGS. 7 to 9, a display device 200 may include a cover window 302 and a flexible display panel 10. The cover window 302 may include a lens unit 40 in one or more portions (e.g., left and right edges) thereof. The display area DA of the flexible display panel 10 may be bent in accordance with the configuration of the lens unit 40. In this manner, the display device 200 may include a wider screen due, at least in part, to the omission of the left and right bezel areas 32L and 32R illustrated in association with display device 100. To this end, it is noted that display device 200 may be configured substantially similar to display device 100, and, as such, differences are described below to avoid obscuring exemplary embodiments.

According to exemplary embodiments, the cover window 302 may include a flat part 35 and the lens unit 40. The lens unit 40 may be connected with a vertical part 36. It is noted that although FIGS. 7 and 9 illustrate the vertical part 36, the vertical part 36 may be omitted. The flat part 35 and the lens unit 40 may be disposed parallel to one another in left and right directions, with the lens unit 40 bending from the flat part 35.

Figure 10:
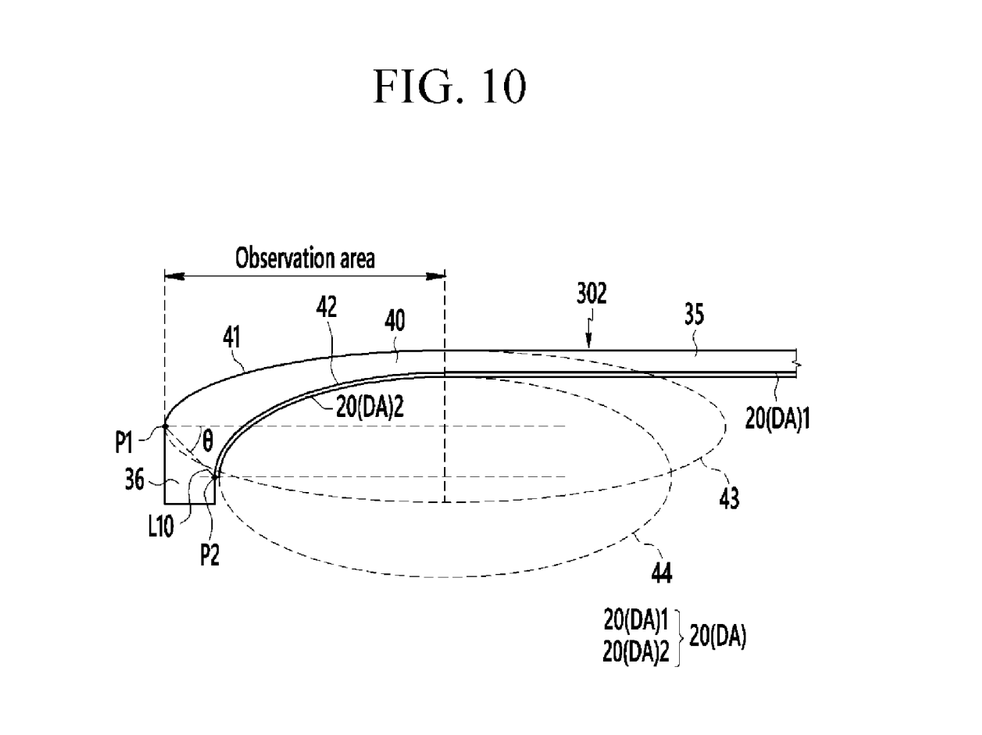
FIGS. 10 and 11 are partial cross-sectional views of the cover window of the display device of FIG. 7, according to exemplary embodiments.
Figure 11:
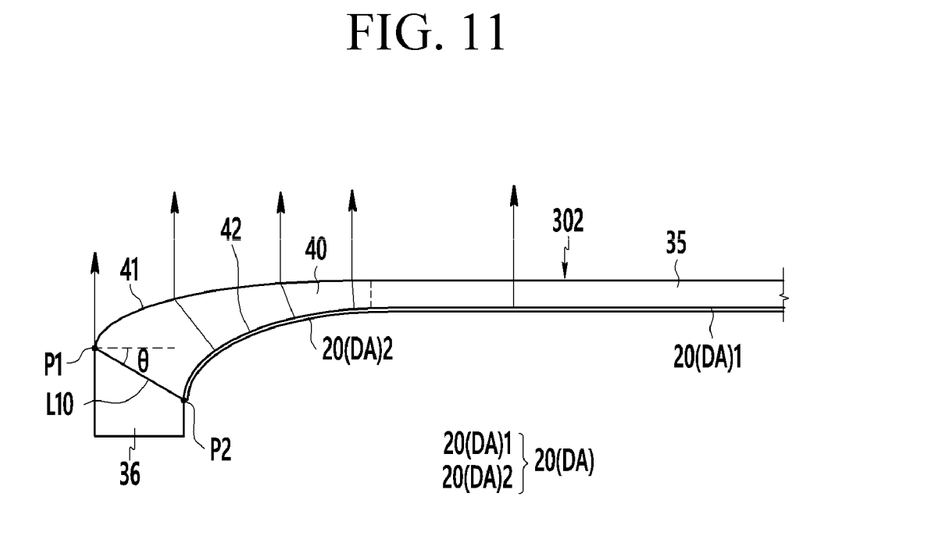

FIGS. 10 and 11 are partial cross-sectional views of the cover window of the display device of FIG. 7, according to exemplary embodiments.

As seen in FIGS. 9 to 11, the lens unit 40 of the cover window 302 includes an external side surface 41 and an internal side surface 42, both of which may include respective arcuate formations, which may be different from one another. In this manner, a width of the lens unit 40 may become thicker in an outward direction, e.g., thicker with increasing distance from the printed circuit board 15. The external side surface 41 of the lens unit 40 may correspond to a quartered arc of a first virtual oval (e.g., external virtual oval 43), whereas the internal side surface 42 thereof may correspond to a quartered arc of a second virtual oval (e.g., internal virtual oval 44). A degree of curvature change in the external virtual oval 43 may be smaller than a degree of curvature change in the external virtual oval 44. The "degree of curvature change" may refer to a difference between the respective curvatures in a unit section of a virtual oval. That is, the curvature may be determined for each point of a virtual oval arc, and a curvature difference between two points (e.g., unit sections) may also be determined.

According to exemplary embodiments, a distal end of the external side surface 41 in a cross section of the cover window 302 may terminate at a first point P1, which may cross a major axis of the external virtual oval 43. Further, a distal end of the internal side surface 42 in a cross section of the cover window may terminate at a second point P2, which may cross a major axis of the internal virtual oval 44. As such, a virtual line L10 may connect the first point P1 and the second point P2. The virtual line L10 may act as a boundary partitioning the lens unit 40 and the vertical part 36. An angle of the virtual line L10 with respect to a surface of the flat part 35 or the major axis of the external virtual oval 43 may be the same as a refractive threshold angle θ of one or more materials utilized to form the cover window 302. The refractive threshold angle θ is an incidence angle at which total internal reflection occurs when light is incident from a material having a larger refractive index to a material having a smaller refractive index.

It is noted that when light is incident to a boundary surface between two media having different densities, reflectivity of the light becomes larger as a density difference and a refractive index difference between the two mediums and the incidence angle becomes larger, which is based on Snell's law (or the law of refraction). When the incidence angle becomes a certain incidence angle through a gradual increase while light proceeds to the medium having a lower density from the medium having a higher density, the refractive angle becomes 90°. The incidence angle may be the refractive threshold angle θ. When light is incident with a larger angle than the refractive threshold angle θ, the light may be completely (e.g., 100%) reflected from the boundary surface without any refracted component. The refractive threshold angle θ may be represented by a ratio of the respective indices of refraction n1 and n2 of the materials, such as shown below in Equation 1.

$$\sin\theta = \frac{n_2}{n_1} \qquad \text{Eq. 1}$$

According to exemplary embodiments, the cover window 302 may be formed of glass, and a refractive index n_glass of the glass may be 1.5. Further, a refractive index n_air of an ambient environment may be 1. Utilizing Equation 1, the refractive threshold angle θ may be about 41.81°. Since the refractive threshold angle changes based on the material of the cover window 302, the virtual line L10 connecting the first point P1 and the second point P2 may be angled at the refractive threshold angle θ based on the respective curvatures of the external and internal virtual ovals 43 and 44.

In exemplary embodiments, the display area DA of the flexible display panel 10 may face the flat part 35 and the lens unit 40 of the cover window 302, such that the left and right ends of the display area DA terminate at the second point P2 of the internal side surface 42 of the lens unit 40. As such, the display area DA may not face the vertical part 36. As seen in FIGS. 9 and 11, an image presented via at least a first portion 20(DA)1 of the display area DA facing the flat part 35 may pass though the flat part 35, and, thereby, observed by a user. An image presented in at least a second portion 20(DA)2 of the display area DA facing the lens unit 40 may be refracted, and, thereby, directed, such that when the image exits the lens unit, the image is directed parallel (or substantially parallel) to the image exiting the flat part 35 of the cover window 32. As such, the image presented via the lens unit 40 may also be observed by the user.

It is noted that when the display area DA passes through the second point P2 to face the vertical part 36, an image presented in at least a portion facing the vertical part 36 may not be refracted substantially parallel to the image exiting the flat part 35 of the cover window 302. As such, a user located in front of the display device 200 may not view the image presented in at least the portion of the of the display area passing through the second point P2.

According to exemplary embodiments, a width of the lens part 40 or a width of an observation area that may be observed by a user may be the same as a radius of the major axis of the external virtual oval 43. The radius of the major axis of the external virtual oval 43 may be the same as a length of the quartered arc of the internal virtual oval 44. In this manner, image distortion of the lens unit 40 may be minimized or at least reduced.

Figure 12:
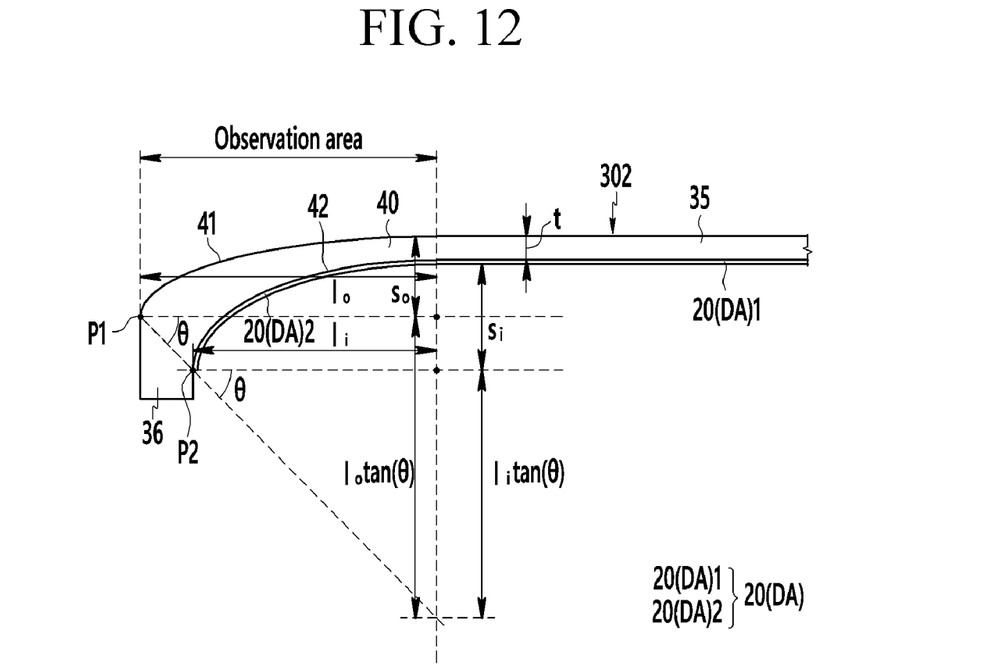
FIG. 12 is a partial cross-sectional view of the cover window of the display device of FIG. 7, according to exemplary embodiments.

FIG. 12 is a partial cross-sectional view of the cover window of the display device of FIG. 7, according to exemplary embodiments. An exemplary embodiment in which a radius $l_0$ of the major axis of the external virtual oval 43 is the same as the length of the quartered arc of the internal virtual oval 44 will be described with reference to FIGS. 10 and 12.

Referring to FIGS. 10 and 12, the lens unit 40 may satisfy Equation 2 provided below.

$$l_0 = \frac{\pi}{2}\sqrt{\frac{l_i^2 + s_i^2}{2}} \qquad \text{Eq. 2}$$

In Equation (2), $l_O$ denotes a major axis radius of the external virtual oval 43, $l_i$ denotes a major axis radius of the internal virtual oval 44, and $s_i$ denotes a minor axis radius of the internal virtual oval 44.

Equation 3 (provided below) provides a relational equation obtained using a trigonometric function between measurements illustrated in FIG. 12.

$$s_0 + l_0 \tan(41.81°) = t + s_i + l_i \tan(41.81°) \qquad \text{Eq. 3}$$

In Equation 3, t denotes a thickness of the flat part 35 of the cover window 35, and $s_O$ denotes a minor axis radius of the external virtual oval 43.

Equations 4 and 5 may be acquired from Equations 2 and 3.

$$s_i = s_0 + l_0\tan(41.81°) - t - \sqrt{\left(\frac{2l_0}{\pi}\right)^2 - s_i^2}\tan(41.81°) \qquad \text{Eq. 4}$$

$$l_0 = \frac{s_0 + l_0\tan(41.81°) - \sqrt{\left(\frac{2l_0}{\pi}\right)^2 - l_i^2}}{\tan(41.81°)} \qquad \text{Eq. 5}$$

When the major axis radius $l_O$ and the minor axis radius $s_O$ of the external virtual oval 43 and the width t of the flat part 35 are provided as in Equations 2 and 3, the major axis radius $l_i$ and the minor axis radius $s_i$ of the internal virtual oval 44 may be determined. Even when the major axis radius $l_i$ and the minor axis radius $s_i$ of the internal virtual oval 44 and the width t of the flat part 35 are given, the major axis radius $l_O$ and the minor axis radius $s_O$ of the external virtual oval 43 may be determined using Equations 2 and 3.

According to exemplary embodiments, the refractive threshold angle θ shown in Equations 2 to 5 corresponds to an embodiment where the cover window 302 is glass, but it is contemplated that the refractive threshold angle θ may be determined differently based on the one or more materials utilized to form the cover window 302. For example, the refractive threshold angle θ may be about 42.16° when the cover window 302 is formed of poly(methyl methacrylate) (PMMA), and the refractive threshold angle θ may be about 39.09° when the cover window 3002 is formed of polycarbonate (PC).

Referring back to FIGS. 7 to 9, the display device 200 may, according to exemplary embodiments, be configured to display an image via an entire area from the left end to the right end of the cover window 302 based on the formation of the lens unit 40. That is, the cover window 302 may include the upper bezel area 32U and the lower bezel area 32D, but the left and right bezel areas 32L and 32R of FIG. 1 may be omitted. As such, the display device 200 may provide a wider screen in comparison with the display device 100. Widths of the upper bezel area 32U and the lower bezel area 32D may be substantially the same as those described in association with the display device 100. Further, the pad area PA may be disposed behind the left end or the right end of the cover window 302, and, thereby, folded or bent in the manner previously described. When the pad area PA is folded as such, a part of the flexible printed circuit board 14 may also be bent, and the flexible printed circuit board 14 and the printed circuit board 15 may be disposed under or behind the display area DA.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a flexible display panel; and
a cover window disposed on the flexible display panel,
wherein the flexible display panel comprises:
a flexible substrate comprising a display area and a peripheral area, the peripheral area being outside the display area;
a pixel circuit layer disposed on the display area; and
a thin film sealing layer disposed on the display area and a first portion of the peripheral area, the pixel circuit layer being sealed between the thin film sealing layer and the flexible substrate,
wherein a second portion of the peripheral area comprises a pad area bent from a plane of the first portion of the peripheral area, the thin film sealing layer terminating prior to the second portion of the peripheral area.

2. The display device of claim 1, wherein the peripheral area surrounds the display area and further comprises a black matrix area.

3. The display device of claim 2, wherein:
the first and second portions of the peripheral area extend from a first side of the display area; and
the black matrix area extends from other sides of display area.

4. The display device of claim 3, wherein the cover window comprises:
a substantially transparent portion facing the display area; and
a substantially opaque bezel area surrounding the substantially transparent portion, the substantially opaque bezel area facing the peripheral area.

5. The display device of claim 4, wherein the substantially opaque bezel area comprises:
a first portion disposed at a second side of the display area;
a second portion disposed at a third side of the display area, the third side opposing the second side;
a third portion disposed at the first side of the display area, the first side intersecting the second side; and
a fourth portion disposed at a fourth side of the display area, the fourth side opposing the first side.

6. The display device of claim 5, wherein:
the first portion of the bezel area faces the first portion of the peripheral area; and
the second portion of the bezel area faces a corresponding portion of the black matrix area.

7. The display device of claim 5, wherein each of the third portion of the bezel area and the fourth portion of the bezel area comprises:
a first area facing a respective portion of the black matrix area; and
a second area extending from the first area.

8. The display device of claim 5, wherein one of the first portion of the substantially opaque bezel area and the second portion of the substantially opaque bezel area corresponds to an upper portion of the cover window.

9. The display device of claim 3, wherein the cover window comprises a lens unit disposed in association with the first side of the display area.

10. The display device of claim 9, wherein:
the cover window comprises a first bezel area and a second bezel area respectively disposed at a second side and a third side of the display area; and
the first bezel area and the second bezel area each comprise a first area facing a corresponding portion of the black matrix area and a second area extending from the first area.

11. A display device, comprising:
a flexible display panel comprising a display area and a pad area; and
a cover window disposed on the flexible display panel, the cover window comprising a flat portion and a curved portion extending from one side of the flat portion,
wherein the curved portion comprises an arcuately-shaped external surface and an arcuately-shaped internal surface,
wherein a first distance between a first point of the arcuately-shaped external surface and a first point of the arcuately-shaped internal surface is different from a second distance between a second point of the arcuately-shaped external surface and a second point of the arcuately-shaped internal surface,
wherein the second point of the arcuately-shaped external surface is farther away from the flat portion than the first point of the arcuately-shaped external surface,
wherein the second point of the arcuately-shaped internal surface is farther away from the flat portion than the first point of the arcuately-shaped internal surface,
wherein the display area is disposed in association with the flat portion, and
wherein the pad area is bent from the display area.

12. The display device of claim 11, wherein:
the arcuately-shaped external surface corresponds to a quartered arc of a first virtual oval;
the arcuately-shaped internal surface corresponds to a quartered arc of a second virtual oval; and
a degree of curvature change of the first virtual oval is smaller than a degree of curvature change of the second virtual oval.

13. The display device of claim 12, wherein the length of a major axis radius of the first virtual oval is substantially the same as the length of the quartered arc of the second virtual oval.

14. The display device of claim 12, wherein:
the arcuately-shaped external surface terminates at a third point disposed on a major axis of the first virtual oval;
the arcuately-shaped internal surface terminates at a fourth point disposed on a major axis of the second virtual oval;
a virtual line connecting the third point and the fourth point longitudinally extends in a direction angled from a surface of the flat portion; and
the angle of the direction is substantially the same as a refractive threshold angle of a material of the cover window.

15. The display device of claim 14, wherein:
the display area is coupled to the arcuately-shaped internal surface of the curved portion; and
distal ends of the display area substantially terminate at respective ones of the second points.

16. The display device of claim 11, wherein the cover window comprises at least one of tempered glass, poly (methyl methacrylate), and polycarbonate.

17. The display device of claim 11, wherein the flexible display panel comprises a portion surrounding the display area, the portion surrounding the display area comprising a black matrix area and a portion of the pad area.

18. The display device of claim 17, wherein:
the portion of the pad area extends from a first side of the display area; and
the black matrix area extends from other sides of the display area.

19. The display device of claim 18, wherein the cover window comprises:
a first portion disposed at a second side of the display area;
a second portion disposed at a third side of the display area, the second side opposing the third side;
a third portion disposed at the first side of the display area, the first side intersecting the second side; and
a fourth portion disposed at a fourth side of the display area, the fourth side opposing the first side.

20. The display device of claim 19, wherein one of the first portion of the cover window and the second portion of the cover window corresponds to an upper portion of the cover window.

21. The display device of claim 11, wherein the second distance is longer than the first distance.

22. The display device of claim 11, wherein the cover window further comprises curved portions extending from respective sides of the flat portion.

23. The display device of claim 11, wherein the curved portion is located in correspondence with the pad area.

24. A display device, comprising:
a flexible display panel; and
a cover window disposed on the flexible display panel, the cover window comprising a flat portion and a curved portion extending from one side of the flat portion,
wherein the flexible display panel comprises:
a flexible substrate comprising a display area and a peripheral area, the peripheral area being outside the display area;
a pixel circuit layer disposed on the display area; and
a thin film sealing layer disposed on the display area and a first portion of the peripheral area, the pixel circuit layer being sealed between the thin film sealing layer and the flexible substrate, and
wherein a thickness of the curved portion of the cover window is different depending on a distance from the flat portion.

* * * * *